United States Patent
Yoshida et al.

(10) Patent No.: US 10,177,227 B1
(45) Date of Patent: Jan. 8, 2019

(54) METHOD FOR FABRICATING JUNCTIONS AND SPACERS FOR HORIZONTAL GATE ALL AROUND DEVICES

(71) Applicant: Applied Materials, Inc., Santa Clara, CA (US)

(72) Inventors: Naomi Yoshida, Sunnyvale, CA (US); Lin Dong, San Jose, CA (US); Shiyu Sun, Santa Clara, CA (US); Myungsun Kim, Pleasanton, CA (US); Nam Sung Kim, Sunnyvale, CA (US); Dimitri Kioussis, Santa Clara, CA (US); Mikhail Korolik, San Jose, CA (US); Gaetano Santoro, Zaventem (BE); Vanessa Pena, Flemish Brabant (BE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/687,747

(22) Filed: Aug. 28, 2017

(51) Int. Cl.
| | |
|---|---|
| H01L 21/02 | (2006.01) |
| H01L 29/06 | (2006.01) |
| H01L 29/417 | (2006.01) |
| H01L 29/786 | (2006.01) |
| H01L 29/66 | (2006.01) |
| H01L 29/423 | (2006.01) |
| H01L 29/78 | (2006.01) |

(52) U.S. Cl.
CPC .... *H01L 29/0673* (2013.01); *H01L 21/02603* (2013.01); *H01L 29/41791* (2013.01); *H01L 29/42392* (2013.01); *H01L 29/66795* (2013.01); *H01L 29/785* (2013.01); *H01L 29/78696* (2013.01); *H01L 2029/7858* (2013.01)

(58) Field of Classification Search
CPC .......... H01L 29/0673; H01L 21/02603; H01L 29/42392; H01L 29/41791; H01L 29/66795; H01L 29/785
See application file for complete search history.

(56) References Cited

U.S. PATENT DOCUMENTS

| | | | |
|---|---|---|---|
| 9,653,289 B1* | 5/2017 | Balakrishnan | ........ H01L 27/088 |
| 2005/0145064 A1 | 7/2005 | Jackson et al. | |
| 2009/0233453 A1 | 9/2009 | Mani et al. | |
| 2010/0075479 A1 | 3/2010 | Kim et al. | |
| 2014/0217502 A1* | 8/2014 | Chang | ............... H01L 29/66477 257/347 |
| 2017/0194430 A1* | 7/2017 | Wood | .................. H01L 29/0673 |
| 2018/0047853 A1* | 2/2018 | Chang | ............... H01L 29/78696 |

* cited by examiner

Primary Examiner — Selim Ahmed
Assistant Examiner — Evan Clinton
(74) Attorney, Agent, or Firm — Patterson + Sheridan, LLP

(57) ABSTRACT

The present disclosure provides methods for forming horizontal gate-all-around (hGAA) structure devices. In one example, a method includes selectively and laterally etching a first group of sidewalls of a first layer in a multi-material layer, wherein the multi-material layer comprises repeating pairs of the first layer and a second layer, the first and the second layers having the first group and a second group of sidewalls respectively, the first group of sidewalls from the first layer exposed through openings defined in the multi-material layer and a group of inner spacers formed atop of the second group of sidewalls from the second layer, forming a recess from the first group of sidewalls of the first layer and defining a vertical wall inward from an outer vertical surface of the inner spacer formed atop of the second layers, and forming an epi-silicon layer from the recess of the first layer.

6 Claims, 15 Drawing Sheets

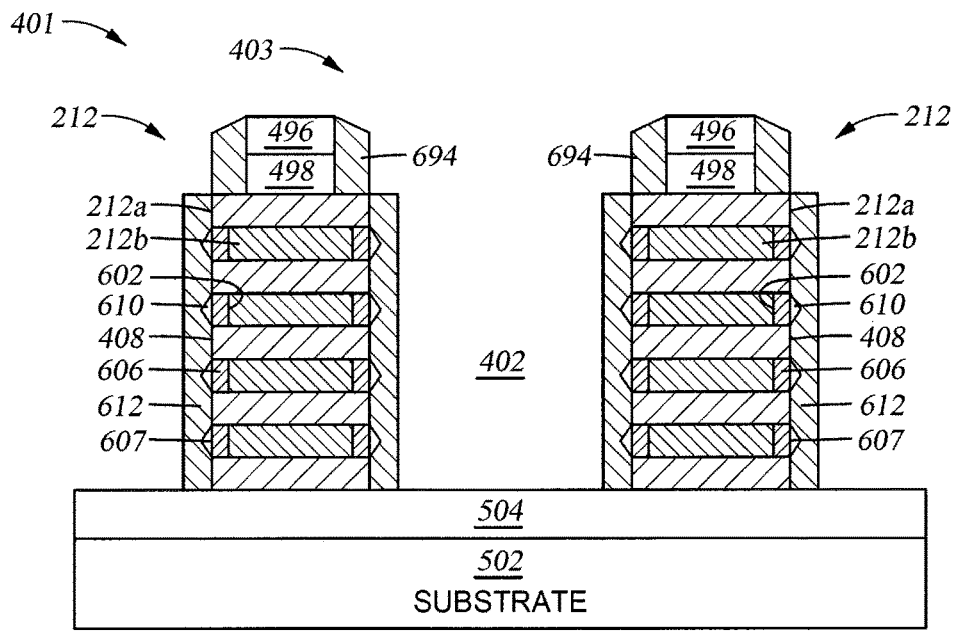
Fig. 6E1
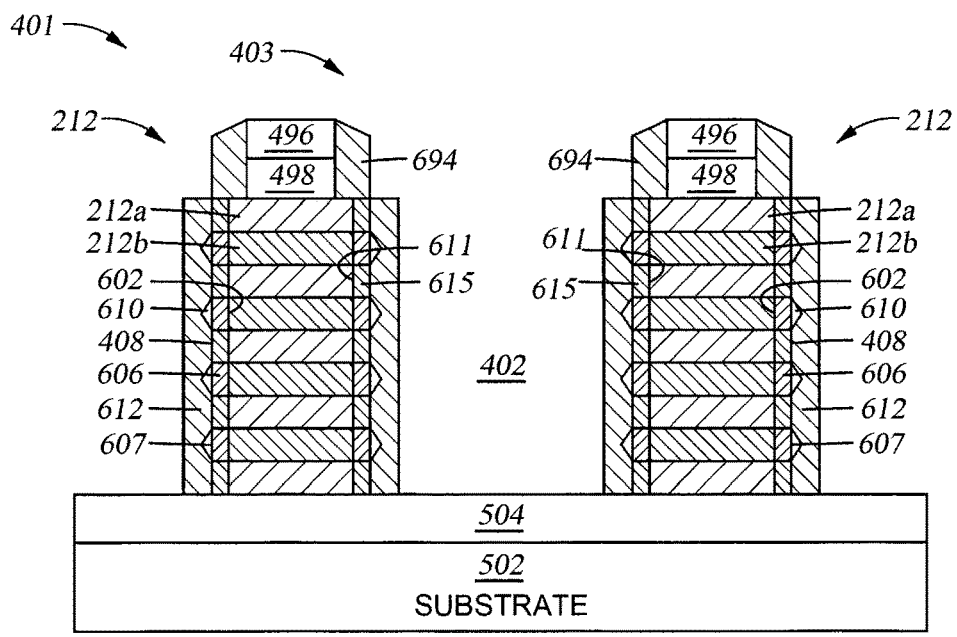
Fig. 6F1

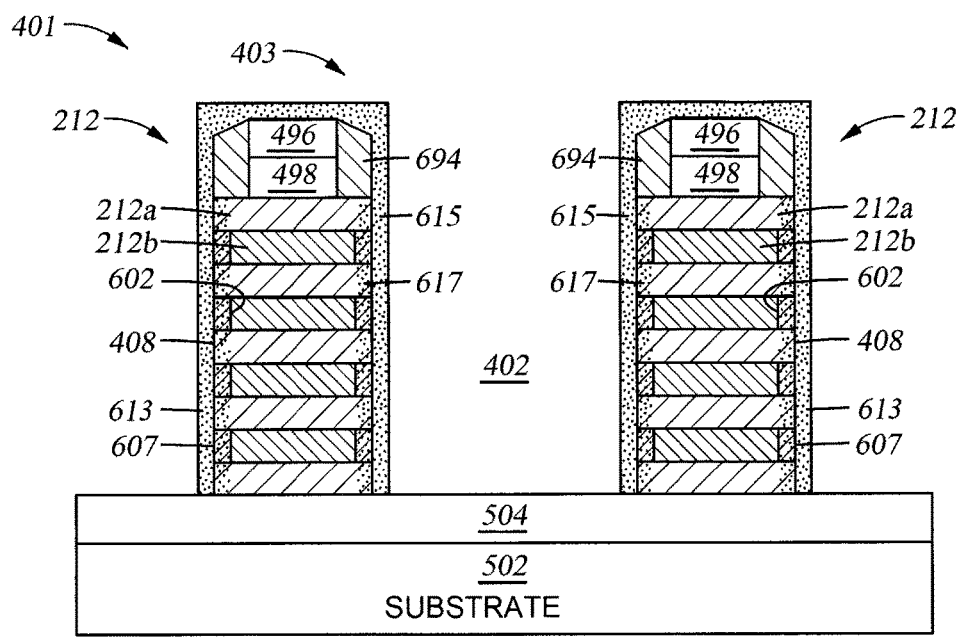
Fig. 6E2
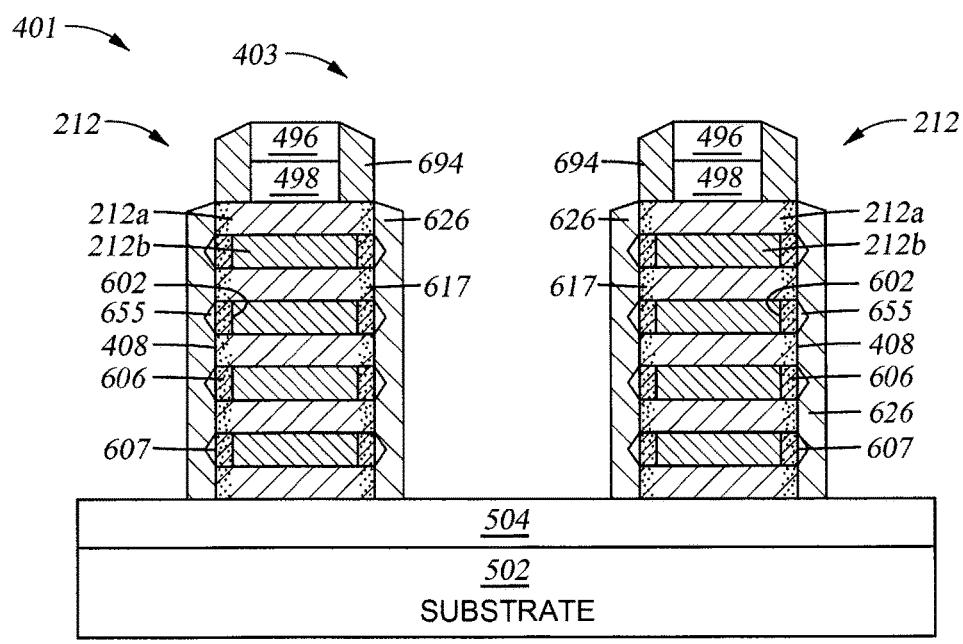
Fig. 6F2

Fig. 6F3

METHOD FOR FABRICATING JUNCTIONS AND SPACERS FOR HORIZONTAL GATE ALL AROUND DEVICES

BACKGROUND

Field

Embodiments of the present invention generally relate to methods for forming vertically stacked nanowires with desired materials on a semiconductor substrate, and more particularly to methods for forming vertically stacked nanowires, spacers and junctions on a semiconductor substrate with desired materials for horizontal gate all around devices for semiconductor manufacturing applications.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

As circuit densities increase for next generation devices, the widths of interconnects, such as vias, trenches, contacts, gate structures and other features, as well as the dielectric materials therebetween, decrease to 25 nm and 20 nm dimensions and beyond, whereas the thickness of the dielectric layers remain substantially constant, with the result of increasing the aspect ratios of the features. Furthermore, reduced channel length often causes significant short channel effect with conventional planar MOSFET architecture. In order to enable fabrication of next generation devices and structures, three dimensional (3D) device structure is often utilized to improve performance of the transistors. In particular, fin field effect transistors (FinFET) are often utilized to enhance device performance. FinFET devices typically include semiconductor fins with high aspect ratios in which the channel and source/drain regions for the transistor are formed thereover. A gate electrode is then formed over and along a side of a portion of the fin devices utilizing the advantage of the increased surface area of the channel and source/drain regions to produce faster, more reliable and better-controlled semiconductor transistor devices. Further advantages of FinFETs include reducing the short channel effect and providing higher current flow. Device structures with hGAA configurations often provide superior electrostatic control by surrounding gate to suppress short channel effect and associated leakage current.

In some applications, horizontal gate-all-around (hGAA) structures are utilized for next generation semiconductor device applications. The hGAA device structure includes several lattice matched channels (e.g., nanowires) suspended in a stacked configuration and connected by source/drain regions.

In hGAA structures, different materials are often utilized to form the channel structures (e.g., nanowires), which may undesirably increase the manufacturing difficulty in integrating all these materials in the nanowire structures without deteriorating the device performance. For example, one of the challenges associated with hGAA structures include the proper amount of dopants doping into the source and drain and their extension regions formed among and adjacent to the nanowire structures. Space constraint often results in insufficient or inaccurate doping concentration in the source and drain and their extension regions, thus resulting in undesired electrical performance of the devices. Improper management and control of conductivity, resistance, and capacitance may result in much degraded device performance.

Thus, there is a need for improved methods for forming channel, spacer, junction, and the source and drain and their extension regions for hGAA device structures on a substrate with good profile and dimension control.

SUMMARY

The present disclosure provides methods for forming nanowire structures as well as source/drain regions with desired materials horizontal gate-all-around (hGAA) structures for semiconductor chips. In one example, a method of forming nanowire structures and source/drain extension regions on a substrate includes selectively and laterally etching a first group of sidewalls of a first layer in a multi-material layer, wherein the multi-material layer comprises repeating pairs of the first layer and a second layer, the first and the second layers having the first group and a second group of sidewalls respectively, the first group of sidewalls from the first layer exposed through openings defined in the multi-material layer and a group of inner spacers formed atop of the second group of sidewalls from the second layer, forming a recess from the first group of sidewalls of the first layer and defining a vertical wall inward from an outer vertical surface of the inner spacer formed atop of the second layers, and forming an epi-silicon layer from the recess of the first layer.

In another example, a method of forming nanowire structures and source/drain regions on a substrate includes selectively and laterally etching a first group of sidewalls of a first layer in a multi-material layer, wherein the multi-material layer comprises repeating pairs of the first layer and a second layer, the first and the second layers having the first group and a second group of sidewalls respectively, the first group and the second groups of sidewalls from the first layer and the second layer respectively exposed through openings defined in the multi-material layer, forming a recess from the first group of sidewalls of the first layer and defining a vertical wall inward from the second group of sidewalls of the second layers, and forming a doping layer over the multi-material layer filling the recess defined in the first layer, wherein the doping layer comprises group III or group V dopants doped therein.

In yet another example, a method of forming nanowire structures and source/drain extension regions on a substrate includes laterally trimming a dimension of a patterned multi-material layer disposed on a substrate from a first width to a second width, wherein the patterned multi-material layer comprises repeating pairs of the first layer and a second layer, the first and the second layers having the first group and a second group of sidewalls respectively, the first group and the second groups of sidewalls from the first layer and the second layer respectively exposed through openings defined in the patterned multi-material layer, selectively and laterally etching a first group of sidewalls of a first layer in the patterned multi-material layer, forming a recess from the first group of sidewalls of the first layer and defining a vertical wall inward from the second group of sidewalls of the second layers, forming an inner spacer in the recess of the first layer, and forming an epi-silicon layer from the second group of sidewalls of the second layers.

DETAILED DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 6A-6I depict cross sectional views of one example of a sequence for forming nanowire structures and source/drain regions with desired materials during the manufacturing process of FIG. 5;

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Methods for manufacturing nanowire structures with controlled parasitic capacitance and resistance for a horizontal gate-all-around (hGAA) semiconductor device structure are provided. In one example, a superlattice structure comprising different materials (e.g., a first material and a second material) arranged in an alternatingly stacked formation may be formed on a substrate to be later utilized as nanowires (e.g., channel structures) for horizontal gate-all-around (hGAA) semiconductor device structures. Several processes may be performed to form source/drain regions adjacent to the nanowire structures with desired single or multiple materials so as to improve electrical performance. Selective etching processes and selective oxidation processes may be performed to selectively etch a pre-determined material at certain locations in the nanowire structures while selectively form another pre-determined material at another locations to form source/drain and their extension regions in the horizontal gate-all-around (hGAA) device structures. A doping material along with an annealing process may be utilized to provide dopants to be doped into adjacent materials to form the source/drain and their extension regions with the desired materials so as to enhance electrical performance of the devices.

Figure 1:
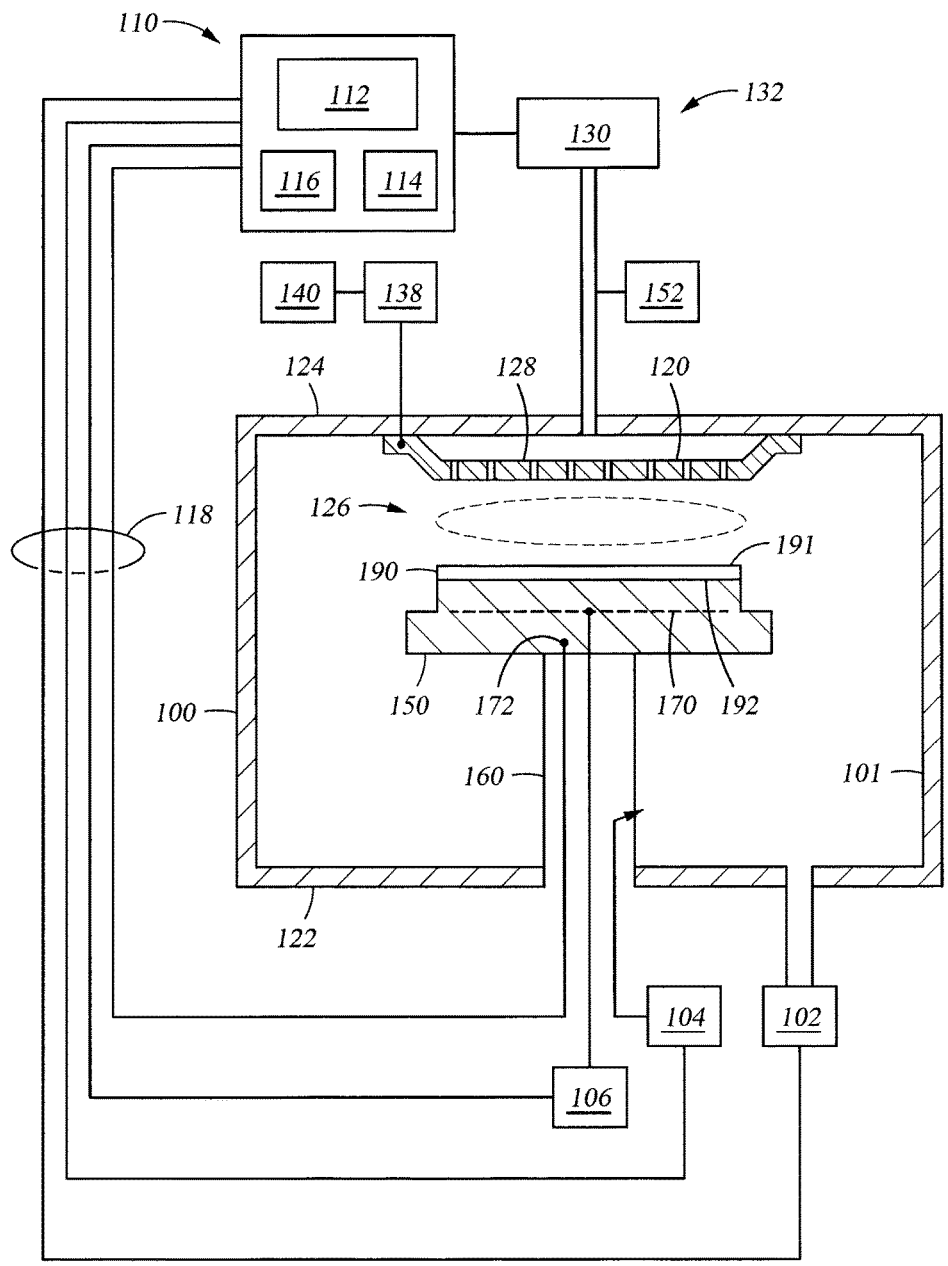
FIG. 1 depicts a plasma processing chamber which may be utilized to perform a deposition process on a substrate.

FIG. 1 is a cross sectional view of an illustrative processing system 132 suitable for performing a selective oxidation process as further described below. The processing system 132 may be a CENTURA®, and Producer® SE or Producer® GT deposition systems, all available from Applied Materials Inc., Santa Clara, Calif. It is contemplated that other processing system, including those available from other manufacturers, may be adapted to practice the invention.

The processing system 132 includes a processing chamber 100 coupled to a gas panel 130 and a controller 110. The processing chamber 100 generally includes a top 124, a side 101 and a bottom wall 122 that define an interior volume 126.

A support pedestal 150 is provided in the interior volume 126 of the chamber 100. The pedestal 150 may be fabricated from aluminum, ceramic, and other suitable materials. In one embodiment, the pedestal 150 is fabricated by a ceramic material, such as aluminum nitride, which is a material suitable for use in a high temperature environment, such as a plasma process environment, without causing thermal damage to the pedestal 150. The pedestal 150 may be moved in a vertical direction inside the chamber 100 using a lift mechanism (not shown).

The pedestal 150 may include an embedded heater element 170 suitable for controlling the temperature of a substrate 190 supported on the pedestal 150. In one embodiment, the pedestal 150 may be resistively heated by applying an electric current from a power supply 106 to the heater element 170. In one embodiment, the heater element 170 may be made of a nickel-chromium wire encapsulated in a nickel-iron-chromium alloy (e.g., INCOLOY®) sheath tube. The electric current supplied from the power supply 106 is regulated by the controller 110 to control the heat generated by the heater element 170, thereby maintaining the substrate 190 and the pedestal 150 at a substantially constant temperature during film deposition at any suitable temperature range. In another embodiment, the pedestal may be maintained at room temperature as needed. In yet another embodiment, the pedestal 150 may also include a chiller (not shown) as needed to cool the pedestal 150 at a range lower than room temperature as needed. The supplied electric current may be adjusted to selectively control the temperature of the pedestal 150 between about 100 degrees Celsius to about 1100 degrees Celsius, for example between 200 degree Celsius to about 1000 degrees Celsius, such as between about 300 degrees Celsius and about 800 degrees Celsius.

A temperature sensor 172, such as a thermocouple, may be embedded in the support pedestal 150 to monitor the temperature of the pedestal 150 in a conventional manner. The measured temperature is used by the controller 110 to control the power supplied to the heater element 170 to maintain the substrate at a desired temperature.

A vacuum pump 102 is coupled to a port formed in the walls 101 of the chamber 100. The vacuum pump 102 is used to maintain a desired gas pressure in the processing chamber 100. The vacuum pump 102 also evacuates post-processing gases and by-products of the process from the chamber 100.

A showerhead 120 having a plurality of apertures 128 is coupled to the top 124 of the processing chamber 100 above the substrate support pedestal 150. The apertures 128 of the showerhead 120 are utilized to introduce process gases into the chamber 100. The apertures 128 may have different sizes, number, distributions, shape, design, and diameters to facilitate the flow of the various process gases for different process requirements. The showerhead 120 is connected to the gas panel 130 that allows various gases to supply to the interior volume 126 during process. A plasma is formed from the process gas mixture exiting the showerhead 120 to enhance thermal decomposition of the process gases resulting in the deposition of material on a surface 191 of the substrate 190.

The showerhead 120 and substrate support pedestal 150 may be formed a pair of spaced apart electrodes in the interior volume 126. One or more RF power sources 140 provide a bias potential through a matching network 138 to the showerhead 120 to facilitate generation of a plasma between the showerhead 120 and the pedestal 150. Alternatively, the RF power sources 140 and matching network 138 may be coupled to the showerhead 120, substrate support pedestal 150, or coupled to both the showerhead 120 and the substrate support pedestal 150, or coupled to an antenna (not shown) disposed exterior to the chamber 100. In one embodiment, the RF power sources 140 may provide between about 10 Watts and about 3000 Watts at a frequency of about 30 kHz to about 13.6 MHz.

An optional water vapor generating (WVG) system 152 is coupled to the processing system 132 that is in fluid communication to the interior volume 126 defined in the processing chamber 100. The WVG system 152 generates ultra-high purity water vapor by means of a catalytic reaction of $O_2$ and $H_2$. In one embodiment, the WVG system 152 has a catalyst-lined reactor or a catalyst cartridge in which water vapor is generated by means of a chemical reaction. The catalyst may include a metal or alloy, such as palladium, platinum, nickel, combinations thereof and alloys thereof.

The controller 110 includes a central processing unit (CPU) 112, a memory 116, and a support circuit 114 utilized to control the process sequence and regulate the gas flows from the gas panel 130 and the WVG system 152. The CPU 112 may be of any form of a general purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the processing system 132 are handled through numerous signal cables collectively referred to as signal buses 118, some of which are illustrated in FIG. 1.

Figure 2:
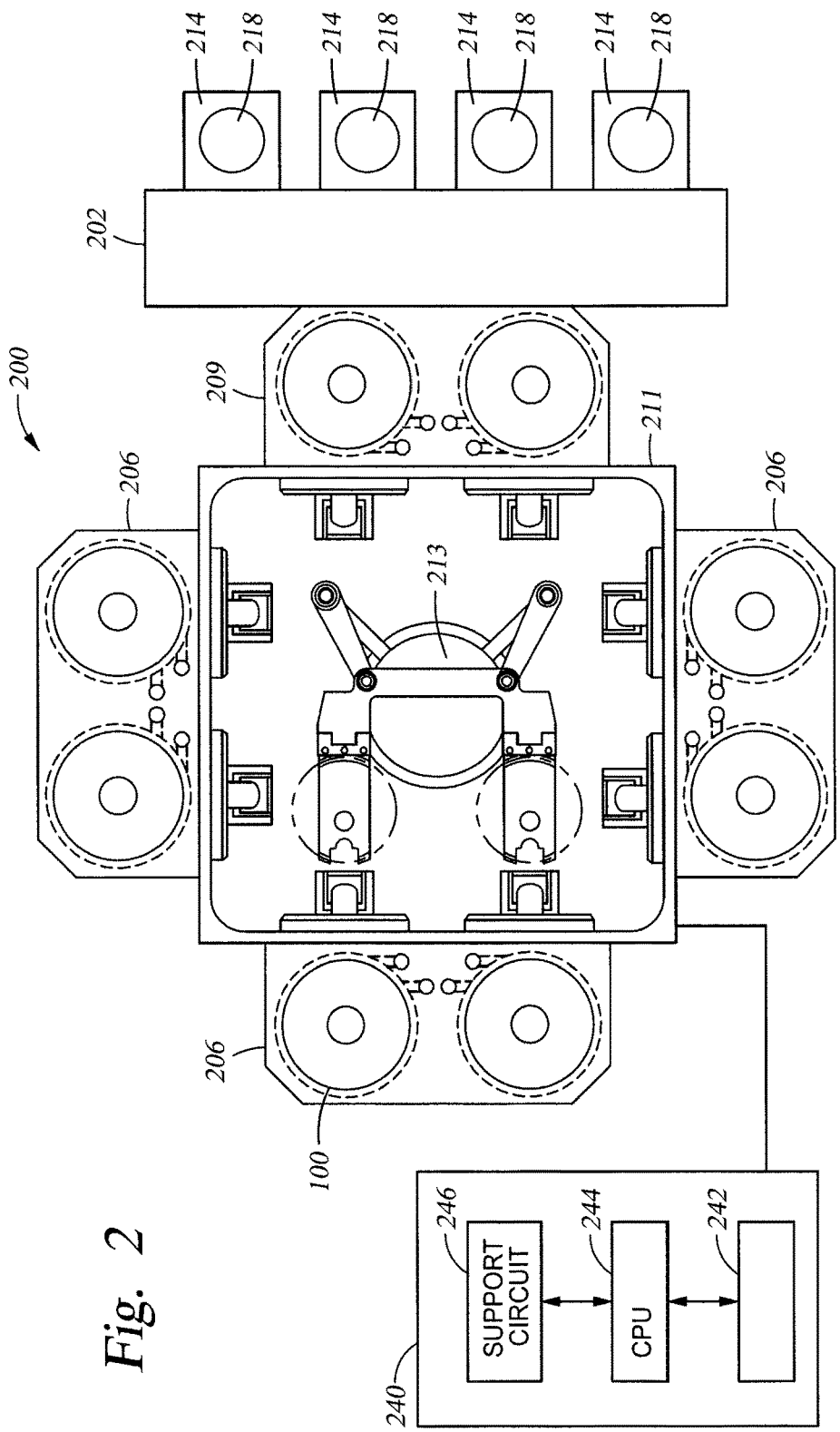
FIG. 2 depicts a processing system that may include plasma processing chambers of FIG. 1 to be incorporated therein.

FIG. 2 depicts a plan view of a semiconductor processing system 200 that the methods described herein may be practiced. One processing system that may be adapted to benefit from the invention is a 300 mm Producer™ processing system, commercially available from Applied Materials, Inc., of Santa Clara, Calif. It is noted that other systems, such as Centura™ or Endura™ processing systems may also be utilized as needed. The processing system 200 generally includes a front platform 202 where substrate cassettes 218 included in FOUPs 214 are supported and substrates are loaded into and unloaded from a loadlock chamber 209, a transfer chamber 211 housing a substrate handler 213 and a series of tandem processing chambers 206 mounted on the transfer chamber 211.

Each of the tandem processing chambers 206 includes two process regions for processing the substrates. The two process regions share a common supply of gases, common pressure control, and common process gas exhaust/pumping system. Modular design of the system enables rapid conversion from any one configuration to any other. The arrangement and combination of chambers may be altered for purposes of performing specific process steps. Any of the tandem processing chambers 206 can include a lid according to aspects of the invention as described below that includes one or more chamber configurations described above with referenced to the processing chamber 100 depicted in FIG. 1. It is noted that the processing chamber 100 may be configured to perform a deposition process, etching process, curing processes, or heating/annealing process as needed. In one embodiment, the processing chamber 100, shown as a single chamber designed, may be incorporated into the semiconductor processing system 200.

In one implementation, the processing system 132 can be adapted with one or more of the tandem processing chambers having supporting chamber hardware known to accommodate various other known processes such as chemical vapor deposition (CVD), physical vapor deposition (PVD), etching, curing, or heating/annealing and the like. For example, the system 200 can be configured with one of the processing chambers 100 as a plasma deposition chamber for deposition, such as a dielectric film, on the substrates. Such a configuration can maximize research and development fabrication utilization and, if desired, eliminate exposure of films as etched to atmosphere.

A controller 240, including a central processing unit (CPU) 244, a memory 242, and support circuits 246, is coupled to the various components of the semiconductor processing system 200 to facilitate control of the processes of the present invention. The memory 242 can be any computer-readable medium, such as random access memory (RAM), read only memory (ROM), floppy disk, hard disk, or any other form of digital storage, local or remote to the semiconductor processing system 200 or CPU 244. The support circuits 246 are coupled to the CPU 244 for supporting the CPU in a conventional manner. These circuits include cache, power supplies, clock circuits, input/output circuitry and subsystems, and the like. A software routine or a series of program instructions stored in the memory 242, when executed by the CPU 244, executes the tandem processing chambers 206.

Figure 3:
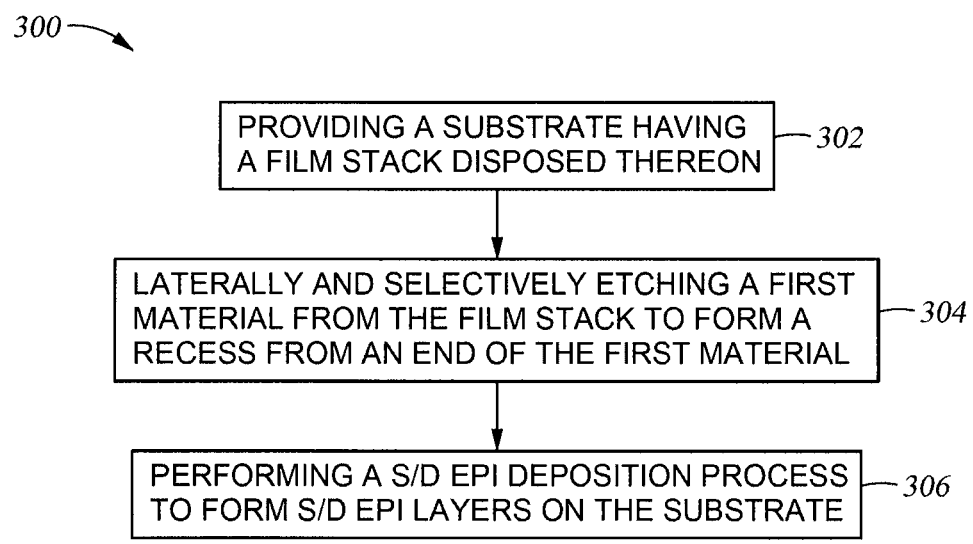
FIG. 3 depicts a flow diagram of a method for manufacturing nanowire structures and source/drain regions formed on a substrate.

FIG. 3 is a flow diagram of one example of a method 300 for manufacturing nanowire structures (e.g., channel structures) and source/drain and their regions with composite materials for horizontal gate-all-around (hGAA) semiconductor device structures. FIGS. 4A-4D are cross-sectional views of a portion of a composite substrate corresponding to various stages of the method 300. The method 300 may be utilized to form the nanowire structure and the source/drain and their regions for horizontal gate-all-around (hGAA) semiconductor device structures on a substrate having desired materials. Alternatively, the method 300 may be beneficially utilized to manufacture other types of structures.

Figure 4A:
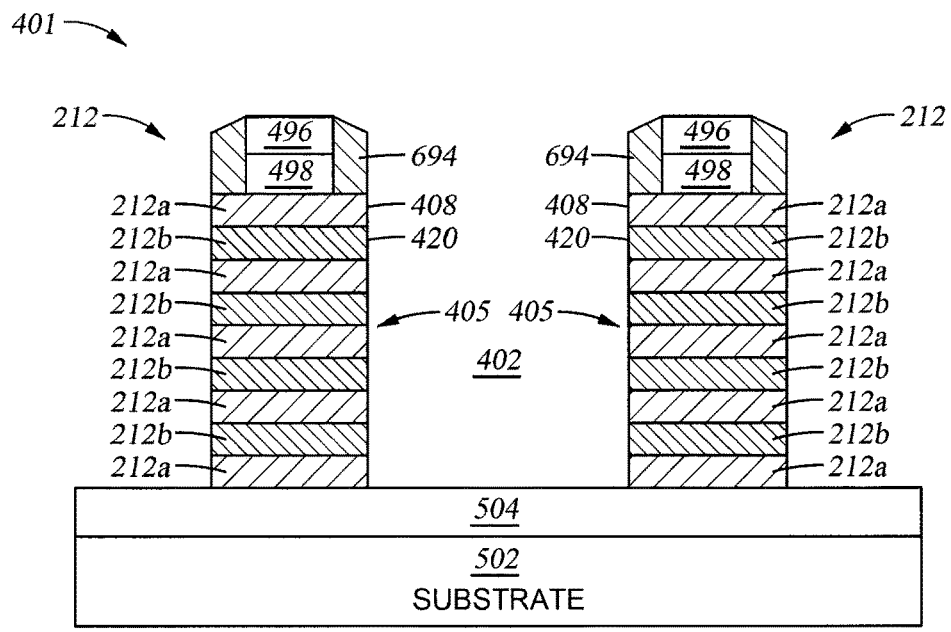
FIGS. 4A-4D depict cross sectional views of one example of a sequence for forming nanowire structures and source/drain regions with desired materials during the manufacturing process of FIG. 3.

The method 300 begins at operation 302 by providing a substrate, such as the substrate 502 depicted in FIG. 4A, having a film stack 401 formed thereon. The substrate 502 may be a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 502 may have various dimensions, such as 200 mm, 300 mm, 450 mm or other diameter, as well as, being a rectangular or square panel. Unless otherwise noted, examples described herein are conducted on substrates with a 200 mm diameter, a 300 mm diameter, or a 450 mm diameter substrate.

The film stack 401 includes a multi-material layer 212 disposed on an optional material layer 504. A dummy gate structure 498 along with a hardmask layer 496 may also be formed on the multi-material layer 212 to facilitate transferring features into the multi-material layer 212. A sidewall spacer 694 may be formed on sidewalls of the dummy gate structure 498 and the hardmask layer 496 as needed. In the embodiments wherein the optional material layer 504 is not present, the film stack 401 may be directly formed on the substrate 502 as needed. In one example, the optional material layer 504 is an insulating material. Suitable examples of the insulating material may include silicon oxide material, silicon nitride material, silicon oxynitride material, or any suitable insulating materials. Alternatively, the optional material layer 504 may be any suitable materials including conductive material or non-conductive material as needed. The multi-material layer 212 includes at least one pair of layers, each pair comprising a first layer 212a and a second layer 212b. Although the example depicted in FIG. 4A shows four pairs, each pair including the first layer 212a and the second layer 212b (alternating pairs, each pair comprising the first layer 212a and the second layer 212b), it is noted that number of pairs, each comprising a first layer 212a and a second layer 212b, may be varied based on different process needs. In one particular embodiment, 4 pairs of the first and second layers, 212a, 212b may be deposited to form the multi-material layer 212 on the substrate 502. In one implementation, the thickness of each single first layer 212a may be at between about 20 Å and about 200 Å, such as about 50 Å, and the thickness of the each single second layer 212b may be at between about 20 Å and about 200 Å, such as about 50 Å. The multi-material layer 212 may have a total thickness between about 10 Å and about 5000 Å, such as between about 40 Å and about 4000 Å.

The first layer 212a may be a crystalline silicon layer, such as a single crystalline, polycrystalline, or monocrystalline silicon layer, formed by an epitaxial deposition process. Alternatively, the first layer 212a a may be a doped silicon layer, including a p-type doped silicon layer or a n-type doped layer. Suitable p-type dopant includes B dopants, Al dopants, Ga dopants, In dopants, or the like. Suitable n-type dopant includes N dopants, P dopants, As dopants, Sb dopants, or the like. In yet another example, the first layer 212a may be a group III-V material, such as a GaAs layer. The second layer 212b may be a Ge containing layer, such as a SiGe layer, Ge layer, or other suitable layer. Alternatively, the second layer 212b may be a doped silicon layer, including a p-type doped silicon layer or a n-type doped layer. In yet another example, the second layer 212b may be a group III-V material, such as a GaAs layer. In still another example, the first layer 212a may be a silicon layer and the second layer 212b is a metal material having a high-k material coating on outer surfaces of the metal material. Suitable examples of the high-k material includes hafnium dioxide (HfO2), zirconium dioxide (ZrO2), hafnium silicate oxide (HfSiO4), hafnium aluminum oxide (HfAlO), zirconium silicate oxide (ZrSiO4), tantalum dioxide (TaO2), aluminum oxide, aluminum doped hafnium dioxide, bismuth strontium titanium (BST), or platinum zirconium titanium (PZT), among others. In one particular implementation the coating layer is a hafnium dioxide (HfO2) layer.

In the particular example depicted in FIG. 4A, the first layer 212a is a crystalline silicon layer, such as a single crystalline, polycrystalline, or monocrystalline silicon layer. The second layer 212b is a SiGe layer.

In some examples, a hardmask layer (not shown in FIG. 4A) and/or a patterned photoresist layer may be disposed on the multi-material layer 212 for patterning the multi-material layer 212. In the example shown in FIG. 4A, the multi-material layer 212 has been patterned in the previous patterning processes to form openings 402 along sidewalls 405 of the multi-material layer 212, which may later have source/drain anchors and extensions formed therein, in the multi-material layer 212.

In the implementation wherein the substrate 502 is a crystalline silicon layer and the optional material layer 504 is a silicon oxide layer, the first layer 212a may be intrinsic epi-silicon layer and the second layer 212b is a SiGe layer. In another implementation, the first layer 212a may be a doped silicon containing layer and the second layer 212b may be an intrinsic epi-silicon layer. The doped silicon containing layer may be a p-type dopant or a n-type dopant, or a SiGe layer as needed. In yet another implementation wherein the substrate 502 is a Ge or GaAs substrate, the first layer 212a may be a SiGe layer and the second layer 212b may be an intrinsic epi-Ge layer or vice versa. In still another implementation wherein the substrate 502 is a GaAs layer with dominantly a crystalline plane at <100>, the first layer 212a may be an intrinsic Ge layer and the second layer 212b is a GaAs layer or vise versa. It is noted that the selection of the substrate materials along with the first layer 212a and the second layer 212b in the multi-material layer 212 may be in different combinations utilizing the materials listed above.

Figure 4B:
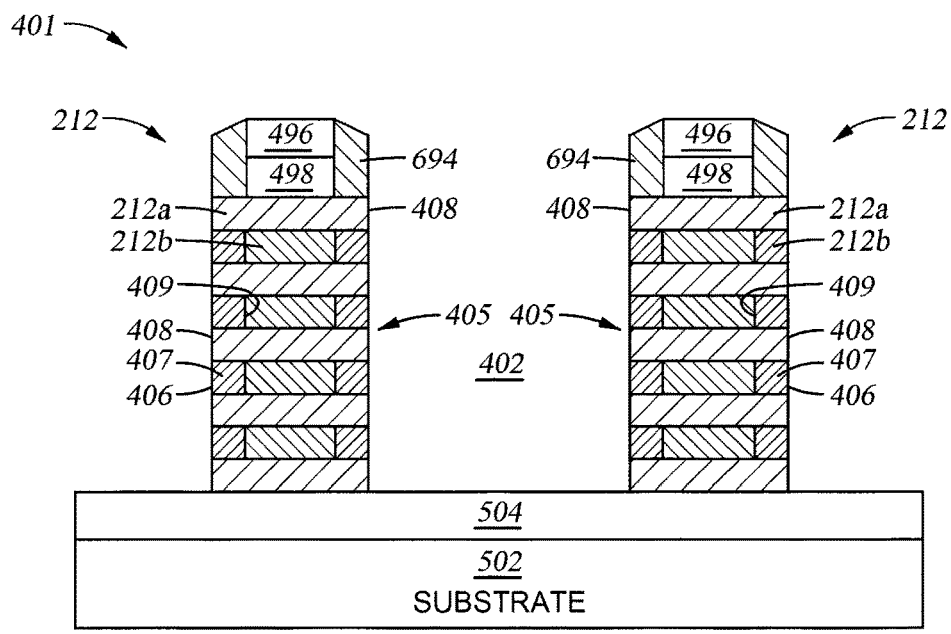

In one example, the second layer 212b of the SiGe layer may be laterally etched to form an inner spacer 407 at each sidewall 409 of the second layer 212b, as shown in FIG. 4B. The inner spacer 407 is an oxidation layer formed from the second layer 212b having a sidewall 406 substantially aligned with sidewalls 409 of the first layer 202a so as to provide a straight sidewall profile as desired for the nanowire structures 403. It is believed that the inner spacer 407 formed at the interface may reduce parasitic capacitance and minimize device leakage. In one embodiment, the inner spacer 407 may have a thickness between about 3 nm an about 15 nm, such as between about 7 nm and about 8 nm.

Figure 4C:
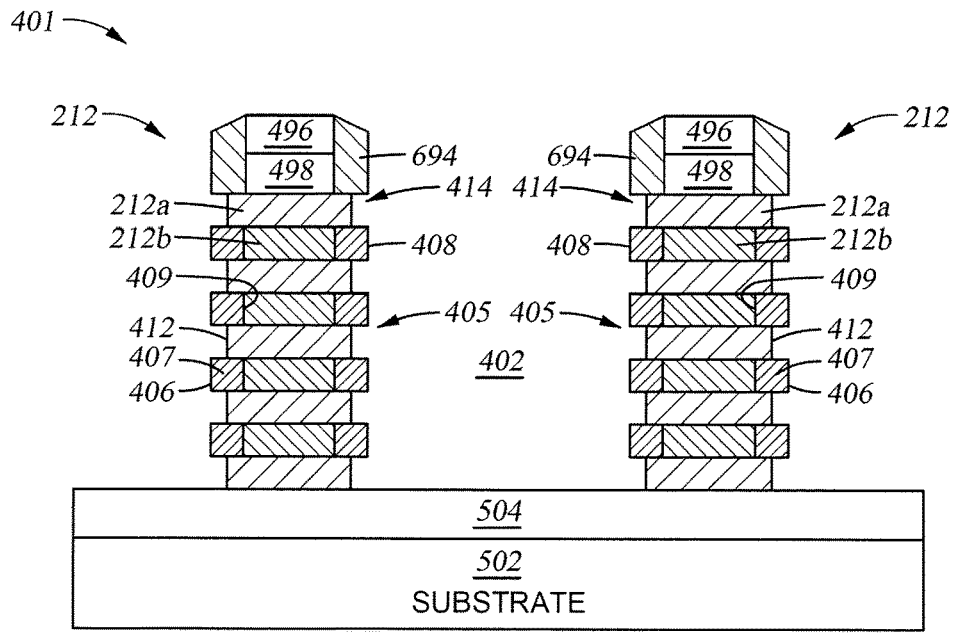

At operation 302, a lateral etching process is performed to laterally remove a portion of the first layer 212a from its sidewalls 408 from the first layer 212a, as shown in FIG. 4C. The lateral etching process is performed to selectively remove partially one type of material from the substrate 502. For example, the first layer 212b may be partially removed as depicted in FIG. 4C, forming a recess 414 at each sidewall 408 of the first layer 212a, forming an exposed sidewall 412 of the first layer 212a.

Based on different process requirements, different etching precursors are selected to selectively and specifically etch the first layer 212a to form the recess 414. In one example, the etching precursors are selected to have high selectivity between the first and the second layers 212a, 212b, and thus are be able to target and laterally etch predominantly the first layer 212a without attacking or damaging the other (i.e., non-target) layer, such as the inner spacer 407 and the second layer 212b. After a desired width of the first layer 212a is removed from the substrate 502, forming the recess 414, the lateral etching process at operation 304 may then be terminated.

In the example depicted in FIG. 4C, the etching precursors are selected particularly to etch the first layer 212a without attacking or damaging the second layer 212b. The etching precursors are selected to particularly etch the first layer 212a without attacking or damaging the second layer 212b. In one example wherein the first layer 212a is an intrinsic epi-Si layer and the second layer 212b is a SiGe layer formed on the substrate 502, the etching precursor selected to etch the second layer 212b include at least a carbon fluorine containing gas and/or a halogen containing gas supplied a plasma processing chamber, such as the processing chamber 100 depicted in FIG. 1. Suitable examples of the carbon fluorine containing gas may include $CF_4$, $C_4F_6$, $C_4F_8$, $C_2F_2$, $CF_4$, $C_2F_6$, $C_5F_8$, and the like. Suitable examples of the halogen containing gas include HF, HBr, $Cl_2$, HCl, $CCl_4$, $CHCl_3$, $CH_2Cl_2$, $CH_3Cl$ and the like. A reacting gas, such as $O_2$ or $N_2$ may also be supplied with the carbon fluorine containing gas and the halogen containing gas to promote the etching process. Further, the halogen containing gas and the carbon fluorine containing gas may be supplied into the processing chamber 100 to generate a plasma by a RF source power or a bias RF power or both, to further assist the etching process.

During the lateral etching process, several process parameters may also be controlled while supplying the etching gas mixture to perform the etching process. The pressure of the processing chamber may be controlled at between about 0.5 milliTorr and about 3000 milliTorr, such as between about 2 milliTorr and about 500 milliTorr. A substrate temperature is maintained between about 15 degrees Celsius to about 300 degrees Celsius, such as greater than 50 degrees Celsius, for example between about 60 degrees Celsius and about 90 degrees Celsius. The RF source power may be supplied at the lateral etching gas mixture between about 50 Watts and about 3000 Watts and at a frequency between about 400 kHz and about 13.56 MHz. A RF bias power may also be supplied as needed. The RF bias power may be supplied at between about 0 Watts and about 1500 Watts.

It is believed that laterally etching of the first layer 212a provides an extra space, the recess 414, above the second layer 212b and the inner spacer 407 at the sidewall 412 of the first layer 212a. The extra space from the recess 414 in the first layer 212a provides a wider process window when forming the source/drain and their extension regions nearby the multi-material layer 212. Thus, by utilizing the extra space from the recess 414, the source/drain and their extension regions formed nearby may be deposited in a controlled manner with desired dimension and materials. In some examples, different material types of the source/drain and their extension regions may also be formed as needed.

Figure 4D:
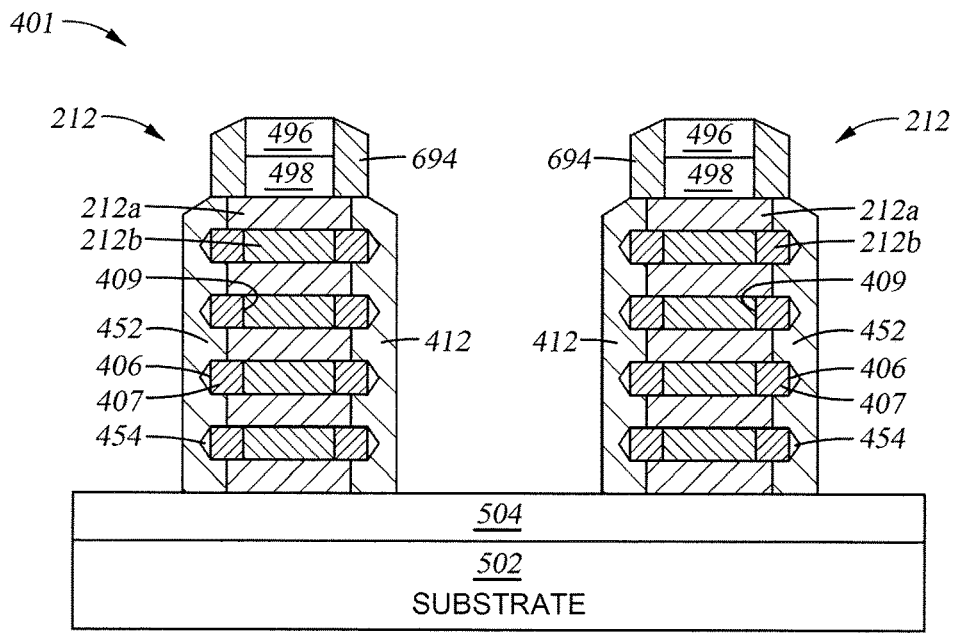

At operation 306, after the first layer 212a is laterally etched, an epitaxial deposition process is performed to selectively grow an epi-silicon layer 452 from the first layer 212a of the multi-material layer 212, as shown in FIG. 4D. As the first layer 212a in this example is selected to fabricate from an intrinsic silicon material, the epitaxial deposition process as performed at operation 306 may grow from the sidewall 412 of the first layer 212a (e.g., a silicon compatible material) rather than the inner spacer 407 (e.g., a silicon dielectric layer or the like rather than an intrinsic silicon material).

The epi-silicon layer 452 may then be continuously grown forming a shaped structure, such as a diamond like top structure, to form the source/drain regions and the source/drain extension regions as needed for horizontal gate-all-around (hGAA) semiconductor devices on the substrate 502. As the epitaxial growth process performed at operation 306 may provide a selective deposition process to form silicon materials predominately atop the sidewall 412 of the first layer 212a, which is a silicon material, as well as on the substrate 502 (when the optional material layer 504 I s not present), which is also a silicon material, a gap 454 (e.g., a void, a space or an air gap) may be formed close to sidewall 406 of the inner spacer 407. The silicon material is inert to the dielectric materials formed from the inner spacer 407. Thus, during the epitaxial deposition process, a selective deposition process is achieved to predominantly deposits the epi-silicon layer 452 atop the sidewall 412 of the first layer 212a as the silicon material is mostly inert to the dielectric materials formed from the inner spacer 407. The gap 454 formed atop of the sidewall 406 of the inner spacer 407 may later be utilized to form as part of the nanowire spacer (along with the inner spacer 407) for nanowire structures for horizontal gate-all-around (hGAA) semiconductor devices on a substrate.

The epitaxial growth of the silicon naturally grows onto silicon materials, such as the diamond like top structure in most cases, atop the sidewall 412 of the first layer 212a. As the natural shape of the diamond like top structure is controlled by the crystallographic orientation of the silicon material in <111> plane, which normally has the slowest epitaxial growth rate. Thus, the growth rates of the diamond like top structure of the epi-silicon layer 452 are often different on different surfaces of the diamond like top structure of the epi-silicon layer 452, such as different growth rates found from a horizontal surface or from a vertical surface. While different growth rates are often occurred at different surfaces with different crystallographic orientations, the resultant shape of the epi-silicon layer 452 then has a diamond like top structure, rather than a horizontal planar surface. The diamond like top structure of the epi-silicon layer 452 may later be utilized to form source/drain and the source/drain extension regions of a gate structure. The multi-material layer 212 of the first layer 212a and the second layer 212b with the inner spacer 407 formed on the sidewall 409 may be utilized as nanowires in a field effect transistor (FET) with reduced parasitic capacitance and minimum device leakage. The recess 414 defined in the first layer 212a provides extra space that allows the epi-silicon layer 452 to be grown thereon with sufficient space without constraint. Thus, the epi-silicon layer 452 may be securely formed on the first layer 212a with desired adhesion and interface control.

Figure 5:
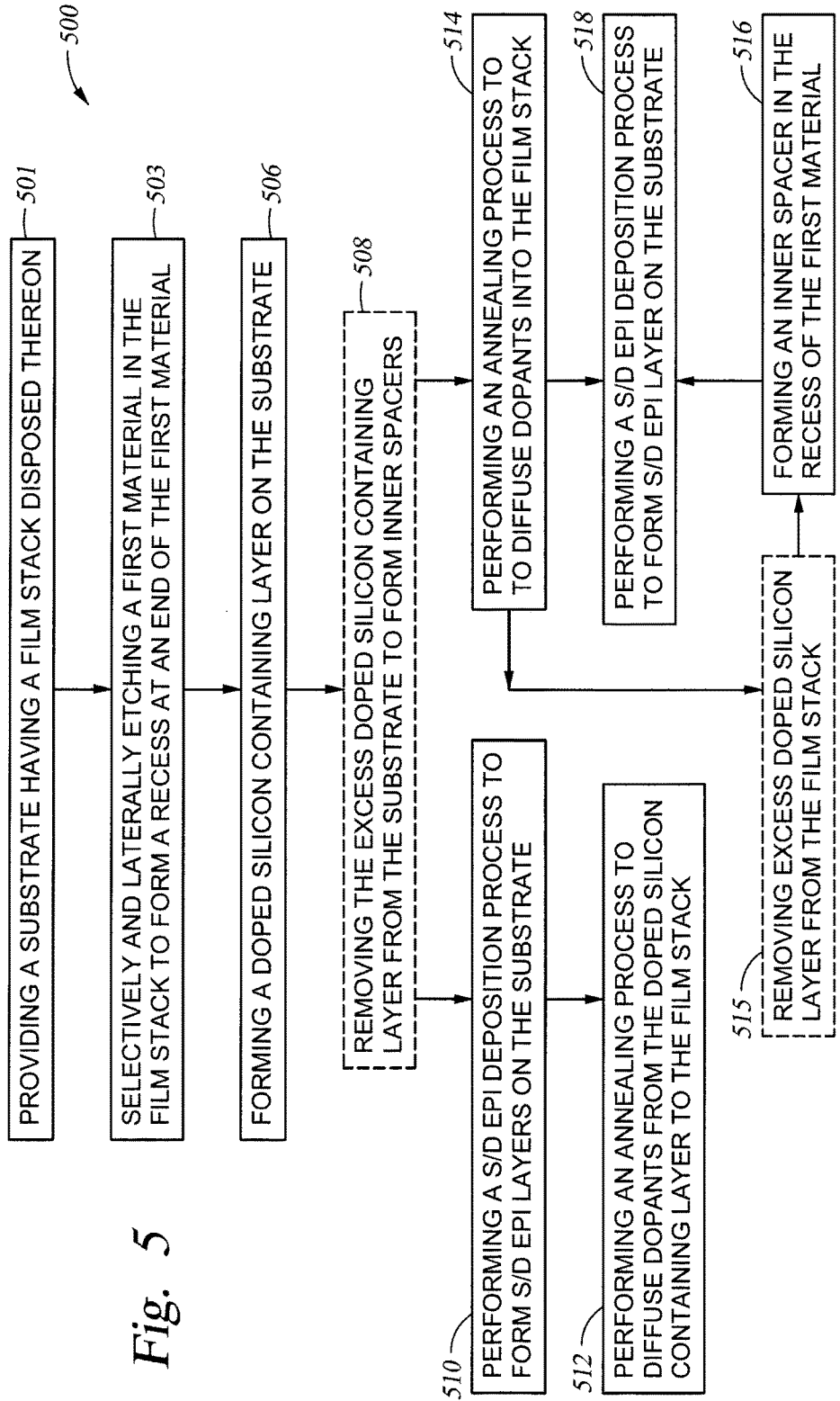
FIG. 5 depicts a flow diagram of a method for manufacturing nanowire structures and source/drain regions formed on a substrate.

FIG. 5 is a flow diagram of one example of a method 500 for manufacturing nanowire structures (e.g., channel structures) and source/drain and their regions with composite materials for horizontal gate-all-around (hGAA) semiconductor device structures. FIGS. 6A-6I are cross-sectional views of a portion of a composite substrate corresponding to various stages of the method 500. The method 500 may be utilized to form the nanowire structure and the source/drain and their regions for horizontal gate-all-around (hGAA) semiconductor device structures on a substrate having desired materials. Alternatively, the method 500 may be beneficially utilized to manufacture other types of structures.

Figure 6A:
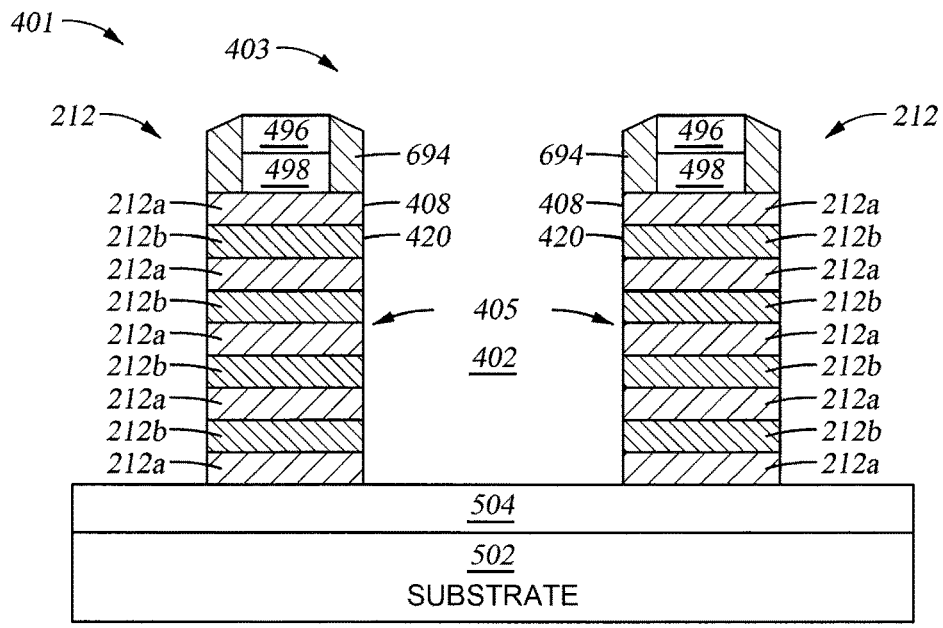

The method 500 begins at operation 501 by providing a substrate, such as the substrate 502 depicted in FIG. 6A, having the film stack 401 formed thereon. As discussed above, the substrate 502 has the film stack 401 including the multi-material layer 212 disposed on the optional material layer 504, as shown in FIG. 6A. The multi-material layer 212 includes at least one pair of layers, each pair comprising the first layer 212a and the second layer 212b.

Figure 6B:
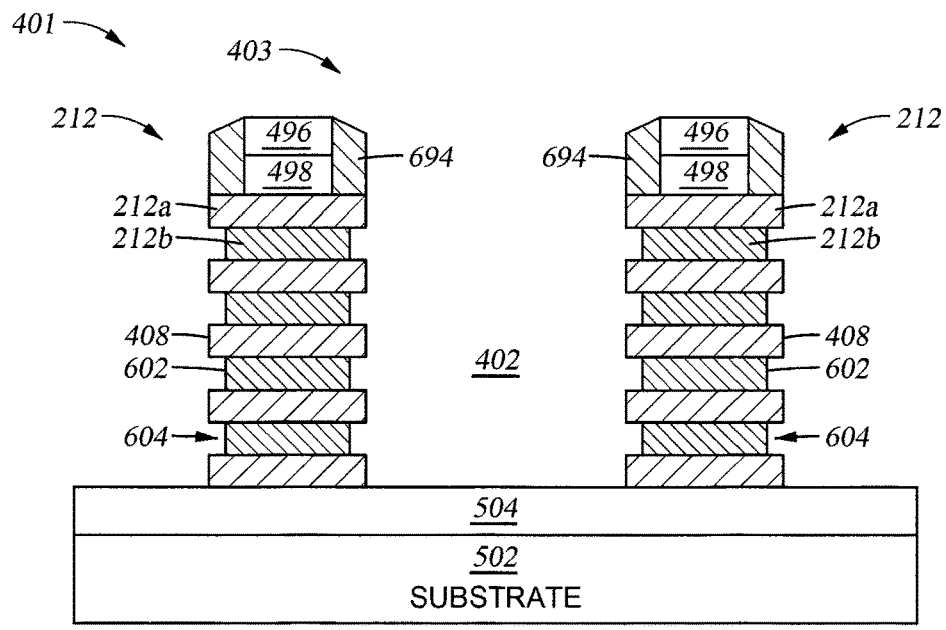

At operation 503, a lateral etching process is performed to laterally remove a portion of the second layer 212b from its sidewalls 602 from the second layer 212b, as shown in FIG. 6B. The lateral etching process is performed to selectively remove partially one type of material from the substrate 502. For example, the second layer 212b may be partially removed as depicted in FIG. 6B, forming a recess 604 at each sidewall 602 of the second layer 212b.

Similarly, as discussed above, based on different process requirements, different etching precursors are selected to selectively and specifically etch the second layer 212b to form the recess 604. In one example, the etching precursors are selected to have high selectivity between the first and the second layers 212a, 212b, and thus are be able to target and laterally etch predominantly the second layer 212b without attacking or damaging the other (i.e., non-target) layer. After a desired width of the second 212b is removed from the substrate 502, forming the recess 604, the lateral etching process at operation 503 may then be terminated.

Figure 6C:
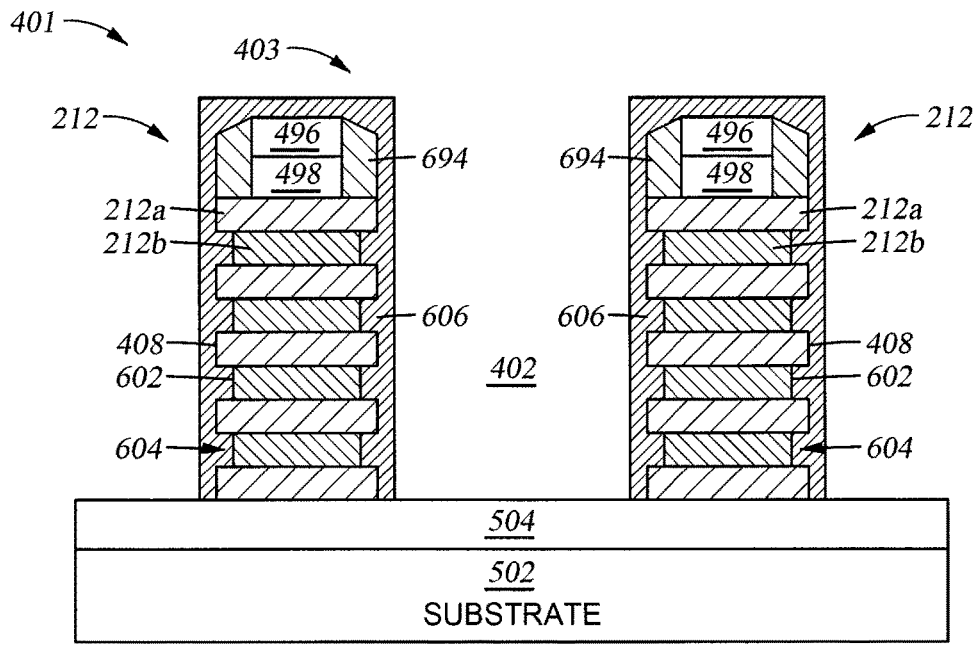

At operation 506, a doped layer 606 is then formed to cover the film stack 401 including the multi-material layer 212 along with the recess 604 defined thereon, as shown in FIG. 6C. The doped layer 606 is formed along the structure of the multi-material layer 212. The doped layer 606 may be a doped dielectric layer, including a p-type doped dielectric layer or a n-type doped dielectric layer. Suitable p-type dopant includes B dopants, Al dopants, Ga dopants, In dopants, or the like. Suitable n-type dopant includes N dopants, P dopants, As dopants, Sb dopants, or the like. In one example, the doped layer 606 may be a boron (B) doped silicon oxide layer, such as borosilicate glass (BSG), when utilized in a PMOS, while the doped layer 606 may be a phosphorus (P) doped silicon oxide layer, such as (PSG), when utilized in a NMOS. It is noted that the doped layer 606 may be utilized in any structures or devices as needed.

In one embodiment, the doped layer 606 may be formed by a doped silicon containing dielectric layer, such as a doped silicon nitride containing layer, a doped silicon carbide containing layer, a doped silicon oxygen containing layer, for example, SiO, SiN, SiON, SiC, SiCN, SiOC or silicon oxycarbonitride or silicon materials with dopants and the like. Dopants formed in the silicon containing dielectric layer may have relatively desired concentration so that the dopants formed in the doped layer 606 may be later out-diffused to the nearby layers as desired during the subsequent thermal processes. In one example, the doped layer 606 is a boron (B) doped silicon oxide layer, such as borosilicate glass (BSG), or phosphorus (P) doped silicon oxide layer. The doped layer 606 may be formed by a CVD process, an ALD process or any suitable deposition techniques in a PVD, CVD, ALD, or other suitable plasma processing chambers. In one example, the doped layer 606 may be formed by a CVD processing chamber, such as the processing chamber 100 depicted in FIG. 1.

Figure 6D:
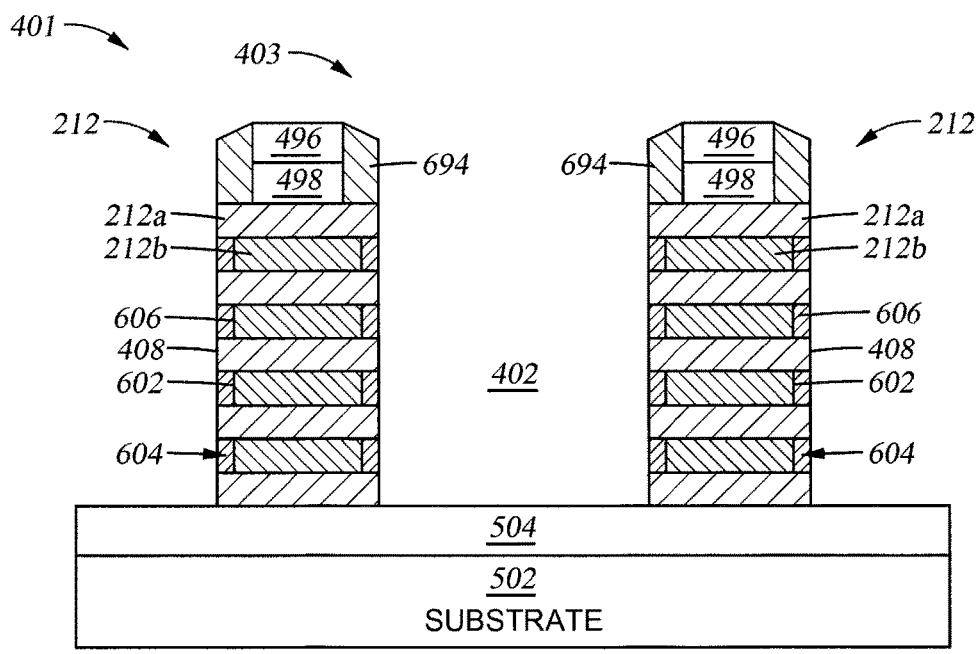

At operation 508, an optional doped silicon layer removal process may be performed. The doped silicon layer removal process may be optionally performed to remove excess and/or redundant doped layer 606 from the film stack 401, predominately filling the recess 604 in the film stack 401, as shown in FIG. 6D. The doped layer 606 is then predominately remained in the recess 604 defined by the second layer 212b after the doped silicon layer removal process at operation 508. The doped layer 606 remained in the recess 604 also severs as an inner spacer that may provide reduced parasitic capacitance and minimized device leakage. The doped layer 606 remained in the recess 604 has a sidewall 607 aligned with the sidewall 408 from the first layer 212a.

In the embodiment wherein the optional doped silicon layer removal process at operation 508 is not performed, the doped layer 606 may be remained on the outer surface of the film stack 401, as shown in FIG. 6C.

The doped layer 606 may be removed by any suitable processes, such as etching, lateral etching and the like.

After the doped layer 606 is filled and formed on the substrate 502, the substrate 502 is then either proceeded to operation 510 or to operation 514. A thermal annealing process may be performed after or prior to an epitaxial deposition process at operation 518 or operation 510 to grow an epi-silicon layer.

Referring first to operation 510, an epitaxial deposition process is performed to grow an epi-silicon layer 612, as shown in FIG. 6E1. The epi-silicon layer 612 is similar to the epi-silicon layer 452 depicted in FIG. 4D. The epi-silicon layer 612 is formed from the first layer 212a of the multi-material layer 212, as shown in FIG. 6E1. As the first layer 212a in this example is selected to fabricate from an intrinsic silicon material, the epitaxial deposition process as performed at operation 510 grows from the sidewall 408 of the first layer 212a (e.g., a silicon compatible material) rather than the doped layer 606 (e.g., a silicon dielectric layer or the like rather than an intrinsic silicon material) formed atop of the second layer 212b.

The epi-silicon layer 612 may then be continuously grown forming a shaped structure, as discussed above, to form the source/drain regions and the source/drain extension regions as needed for horizontal gate-all-around (hGAA) semiconductor devices on the substrate 502. The epitaxial growth process performed at operation 510 forms the silicon materials predominately atop the sidewall 408 of the first layer 212a, a gap 610 (e.g., a void, a space or an air gap), similar to the gap 454 in FIG. 4D, may be formed close to sidewall 607 of the doped layer 606. The silicon material is inert to the dielectric materials formed from the doping layer 606. The gap 610 formed atop of the sidewall 607 of the doping layer 606 may later be utilized to form as part of the nanowire spacer for nanowire structures for horizontal gate-all-around (hGAA) semiconductor devices on a substrate.

The process parameters for forming the epi-silicon layer 612 in the epitaxial deposition process is similar to the operation 306 for forming the epi-silicon layer 452 as discussed above.

At operation 512, after the epi-silicon layer 612 is formed, an annealing process is performed. The annealing process out-diffuses the dopants from the doping layer 606 to the nearby layers, particularly into the first layer 212a in the area above and below the doping layer 606, forming a dopant diffusion region 615, as shown in FIG. 6F1. The dopant diffusion region 615 may have an inner sidewall 611 that substantially aligned with the sidewall 602 of the second layer 212b. The outer sidewall 408 from the original first layer 212a also defines the outer sidewall of the dopant diffusion region 615. Thus, by utilizing the doping layer 606 along with the annealing process at operation 512, the dopants in the doping layer 606 may be diffused and drifted to the nearby layers, thus forming the dopant diffusion region 615 with desired electrical properties that may enhance the performance of the device.

The thermal annealing process is performed to drive movement of the dopants from the doping layer 606 so as to densify and enhance lattice structures of the nearly layers. During the annealing process, dopants from the doping layer 606 may be vertically driven to the first layer 212a. Thus, dopants driven into the first layer 212a may alter the crystallinity and orientation of the crystalline plane of the first layer 212a so as to enhance and adjust the electrical properties of the devices. For example, in the embodiment wherein boron (B) dopants are included in the doping layer 606, during the annealing process, boron dopants may be vertically diffused to the upper and lower first layer 212a, forming boron compounds (such as boron silicide, depending on the materials utilized to form the first layer 212a) so as to adjust the film properties of the layers in the film stack 401.

The thermal annealing process may be performed in a thermal annealing chamber or a plasma processing chamber. Alternatively, the annealing process may be performed in any processing chamber configured to provide enough thermal energy to the film stack 401 disposed on the substrate 502. In one embodiment, the thermal annealing process may be performed in-situ process in the processing chamber wherein the doping layer deposition process at operation 506 was performed. The thermal annealing process may heat the substrate 502 to a temperature greater than 200 degrees Celsius, such as between about 250 degrees Celsius and about 550 degree Celsius, to assist dopants in the doping layer 606 to diffuse outward and vertically from the doping layer 606 and enhance crystallinity and film properties of the first layer 212a and the nearby layers in the film stack 40.

During annealing, an annealing gas mixture may be supplied. Gases that may be supplied in the annealing gas mixture may include a nitrogen containing gas, such as $NH_3$, $N_2$, $NF_3$, $N_2O$, $NO_2$, NO and the like, an inert gas, such as Ar, He, Ne, Kr, Xe or the like, or an oxygen containing gas, such as $O_2$, $O_3$, $N_2O$, $H_2O$, $CO_2$, CO and the like.

As discussed above, the thermal annealing process may be performed prior to the epitaxial deposition process at operation 518. For example, after the doping layer 606 is formed at operation 506 (and/or the excess doping layer is removed at operation 508), the process is then proceeded to operation 514 to perform a thermal annealing process.

The thermal annealing process at operation 514 is similar to the operation 512. After the doping layer 606 is formed on the substrate 502 at operation 506, as shown in FIG. 6D, the thermal process is then performed at operation 514 so that the dopants from the doping layer 606 may be out-diffused to the nearby layers, as shown in FIG. 6E2. In some examples, the dimensions of the doping layer 606 may be expanded due to thermal expansion, as shown in FIG. 6E2, forming an expanded region 613 from the doping layer 606. In the embodiments wherein the thermal energy as provided is relatively mild, the dimension of the doping layer 606 may not be expanded and only the dopants from the doping layer 606 are out-diffused and drifted to the nearly layers in the film stack 401. The expanded region 613 may be later removed by any suitable removal process, if present, at an optional process at operation 515. At operation 515, a removal process is performed to remove the expanded region 613, as shown in FIG. 6F3, thus exposing sidewall 607 of the doping layer 606.

In one example, the dopants from the doping layer 606 is also vertically diffused and driven up or down to the upper first layer 212a, forming a dopant diffusion region 617, similar to the dopant diffusion region 615, as shown in FIGS. 6E2 and 6F3.

At operation 518, after the thermal process is performed on the substrate 502, an epitaxial deposition process at operation 518 is performed to grow an epi-silicon layer 626, as shown in FIG. 6F2. The epi-silicon layer 626 is similar to the epi-silicon layer 452, 612 depicted in FIG. 4D and FIG. 6F1. The epi-silicon layer 626 is formed from the first layer 212a and also the dopant diffusion region 617 from the first layer 212a, as shown in FIG. 6F2. As the first layer 212a in this example is selected to fabricate from an intrinsic silicon material and the dopant diffusion region 617 is also fabricated from doped silicon material (e.g., dopants diffused from the doping layer 606 with either a p-type or n-type dopant), the epitaxial deposition process as performed at operation 518 grows from the sidewall 408 of the first layer 212a (e.g., a silicon compatible material) rather than the doping layer 606 (e.g., a silicon dielectric layer or the like rather than an intrinsic silicon material) formed atop of the second layer 212b.

The epi-silicon layer 626 may then be continuously grown forming a shaped structure, as discussed above, to form the source/drain regions and the source/drain extension regions as needed for horizontal gate-all-around (hGAA) semiconductor devices on the substrate 502. The epitaxial growth process performed at operation 518 forms the silicon materials predominately atop the sidewall 408 of the first layer 212a, a gap 655 (e.g., a void, a space or an air gap), similar to the gap 454 in FIG. 4D or the gap 610 in FIG. 6F1, may be formed close to sidewall 607 of the doping layer 606. The silicon material is inert to the dielectric materials formed from the doping layer 606. The gap 655 formed atop of the sidewall 607 of the doping layer 606 may later be utilized to form as part of the nanowire spacer for nanowire structures for horizontal gate-all-around (hGAA) semiconductor devices on a substrate.

Figure 6G:
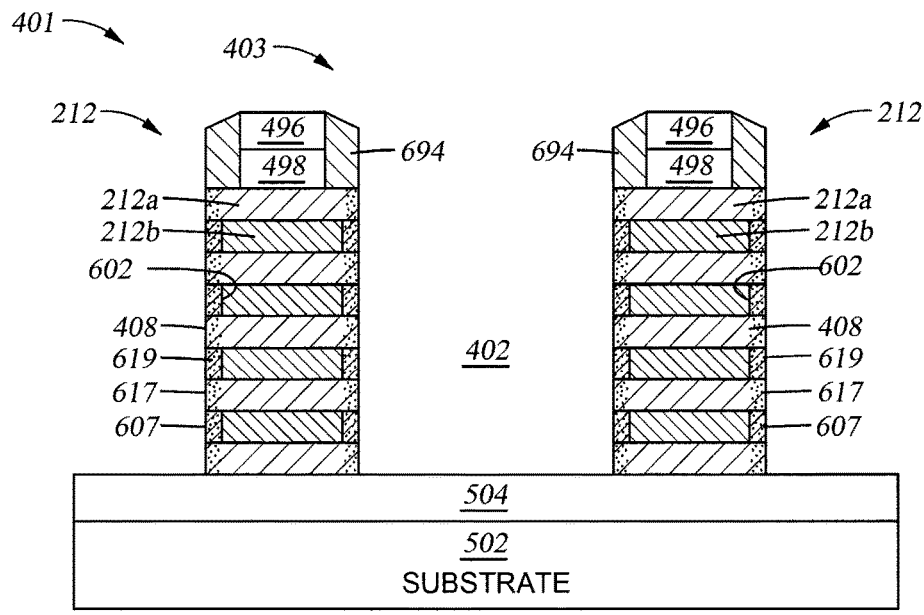
Figure 6G:
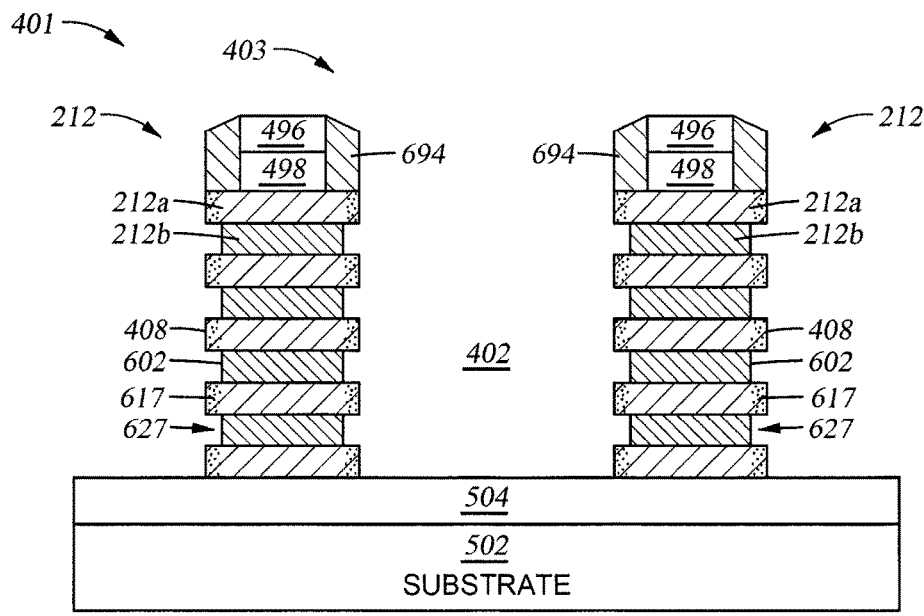

Alternatively, after the thermal process at operation 514 and the optional expansion region removal process at operation 515, the remaining doped layer 606 may be removed, as shown in FIG. 6G, exposing the sidewall 602 of the second layer 212b and forming a recess 627 therefrom.

Figure 6H:
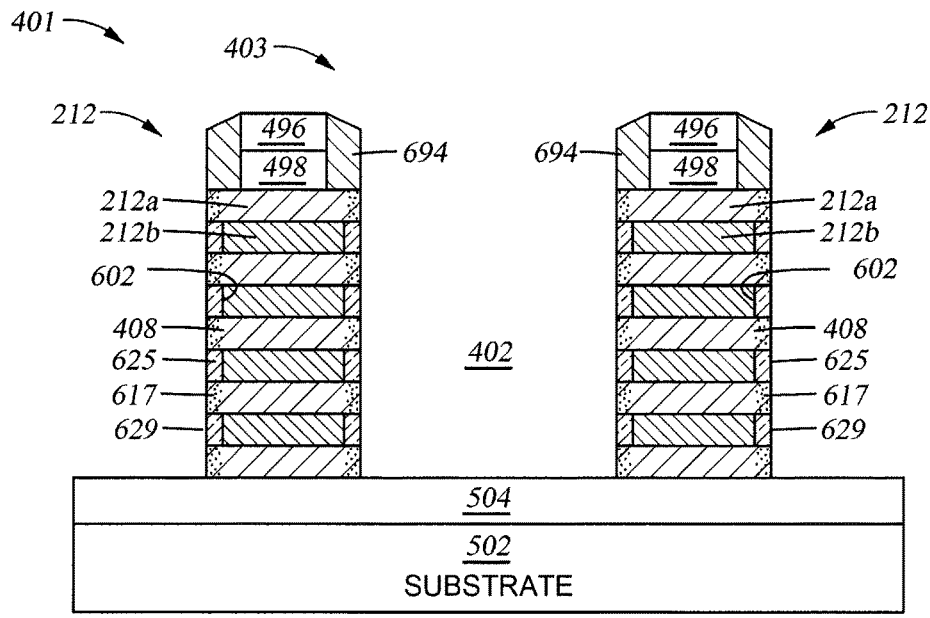
Figure 6I:
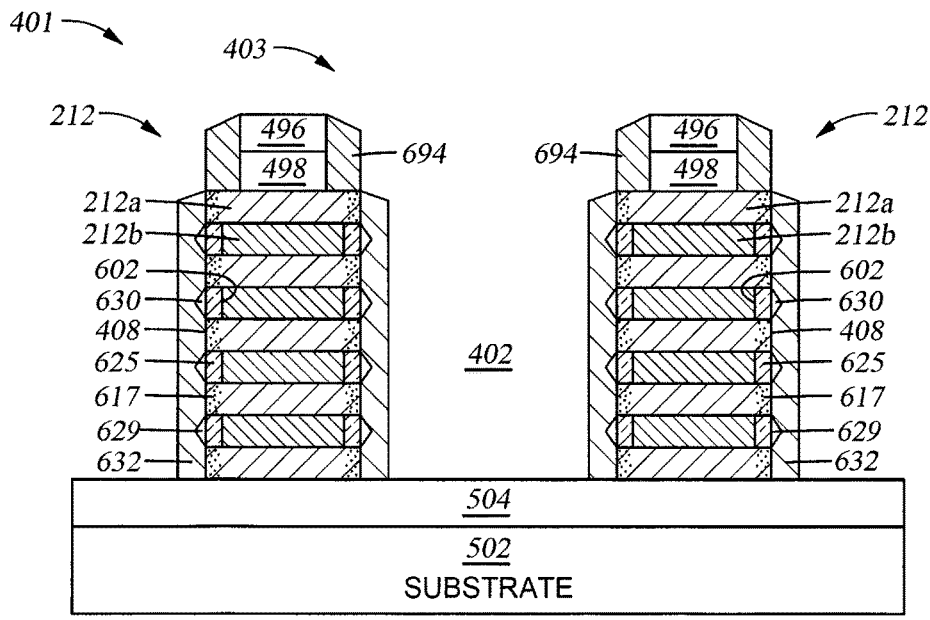

At operation 516, an inner spacer layer 625 is then formed in the recess 627 where the doping layer 606 is removed, as shown in FIG. 6H. In this example, after the thermal process, the dopants from the doping layer 606 has out-diffused to form the dopant diffusion region 617, the doping layer 606 may be then removed and is replaced by the inner spacer layer 625 as needed with the desired film properties. The inner spacer layer 625 provides an outer sidewall 629 aligned with the sidewall 408 of the first layer 212a. The doping layer 606, in this example, is considered as a sacrificial/intermediate structure to provide desired dopants to the nearby layers, such as the first layer 212a. After the dopants are diffused to the desired region and/or the desired dopant diffusion region 617 is formed, the doping layer 606 is then removed.

Similarly, the inner spacer layer 625 as formed in FIG. 6H may be similar to the inner spacer 407 depicted in FIG. 4B.

After the inner spacer layer 625 is formed at operation 516, the process is then proceeded to the operation 518 to form an epi-silicon layer 632, similar to the epi-silicon layer 452, 612, 626 described above, as shown in FIG. 6I. A gap 630, similar to the gap 454, 610 and 655, may also be formed atop of the sidewall 629 of the inner spacer layer 625.

Figure 7:
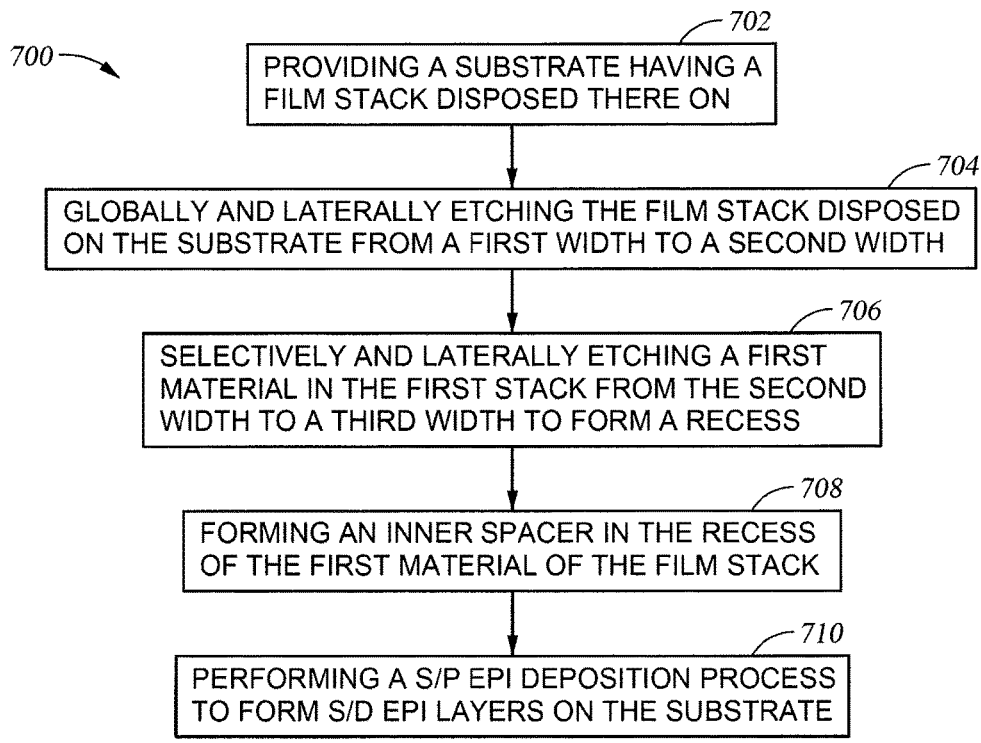
FIG. 7 depicts a flow diagram of a method for manufacturing nanowire structures and source/drain regions formed on a substrate.

FIG. 7 is a flow diagram of one example of a method 700 for manufacturing nanowire structures (e.g., channel structures) and source/drain and their regions with composite materials for horizontal gate-all-around (hGAA) semiconductor device structures. FIGS. 8A-8E are cross-sectional views of a portion of a composite substrate corresponding to various stages of the method 700. The method 700 may be utilized to form the nanowire structure and the source/drain and their regions for horizontal gate-all-around (hGAA) semiconductor device structures on a substrate having desired materials. Alternatively, the method 700 may be beneficially utilized to manufacture other types of structures.

Figure 8A:
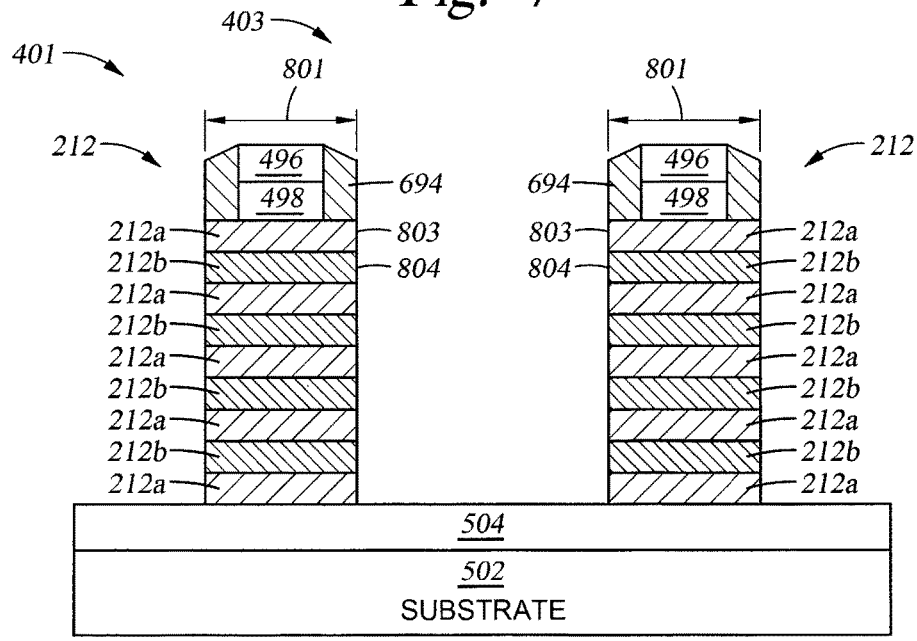
FIGS. 8A-8E depict cross sectional views of one example of a sequence for forming nanowire structures and source/drain regions with desired materials during the manufacturing process of FIG. 7.

Similar to the method 300, 500 described above, the method 700 begins at operation 702 by providing a substrate, such as the substrate 502 depicted in FIG. 8A, having the film stack 401 formed thereon. As discussed above, the substrate 502 has the film stack 401 including the multi-material layer 212 disposed on the optional material layer 504, as shown in FIG. 8A. The multi-material layer 212 has been patterned to have the opening 402 defined in the multi-material layer 212 exposing sidewalls 803, 804 of the first and the second layer 212a, 212b respectively. The multi-material layer 212 has a first width 801 defined therein. The multi-material layer 212 includes at least one pair of layers, each pair comprising the first layer 212a and the second layer 212b.

Figure 8B:
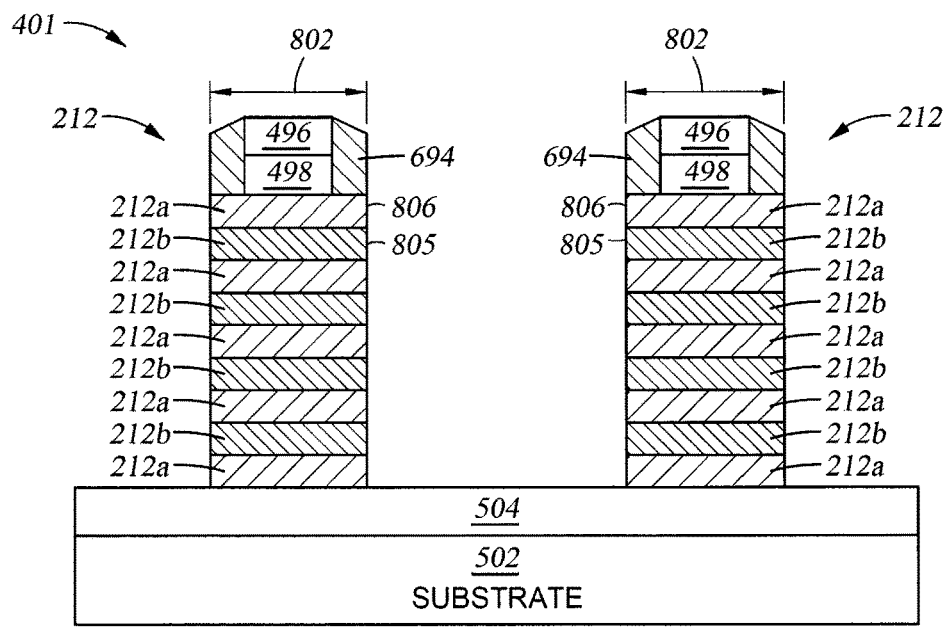

At operation 704, an etching and/or trimming process is performed to globally and laterally etch and trim the multi-material layer 212 so as to shrink the first width 801 of the multi-material layer 212 to a second width 802, as shown in FIG. 8B. The multi-material layer 212 is etched to provide an extra space that allows the source/drain and the extension regions later formed therein having sufficient space as needed.

In one example, based on different process requirements, different etching precursors are selected to globally etch both the first and the second layers 212a, 212b. In one example, the etching precursors are selected to isotopically etch the first and the second layers 212a, 212b until a desired range of the second width 802 is achieved.

The etching precursors include at least a carbon fluorine containing gas and/or a halogen containing gas. Suitable examples of the carbon fluorine containing gas may include $CF_4$, $C_4F_6$, $C_4F_8$, $C_2F_2$, $CF_4$, $C_2F_6$, $C_5F_8$, and the like. Suitable examples of the halogen containing gas include HF, HBr, $Cl_2$, HCl, $CCl_4$, $CHCl_3$, $CH_2Cl_2$, $CH_3Cl$ and the like. A reacting gas, such as $O_2$ or $N_2$ may also be supplied with the carbon fluorine containing gas and the halogen containing gas to promote the etching process. The halogen containing gas and the carbon fluorine containing gas may be supplied into the processing chamber 100 to generate a plasma by a RF source power or a bias RF power or both, to enable the etching process.

In one example, the etching gas mixture globally etches both the first and the second layers 212a, 212b until the multi-material layer 212 has the desired reduced width 802, as shown in FIG. 8B.

Figure 8C:
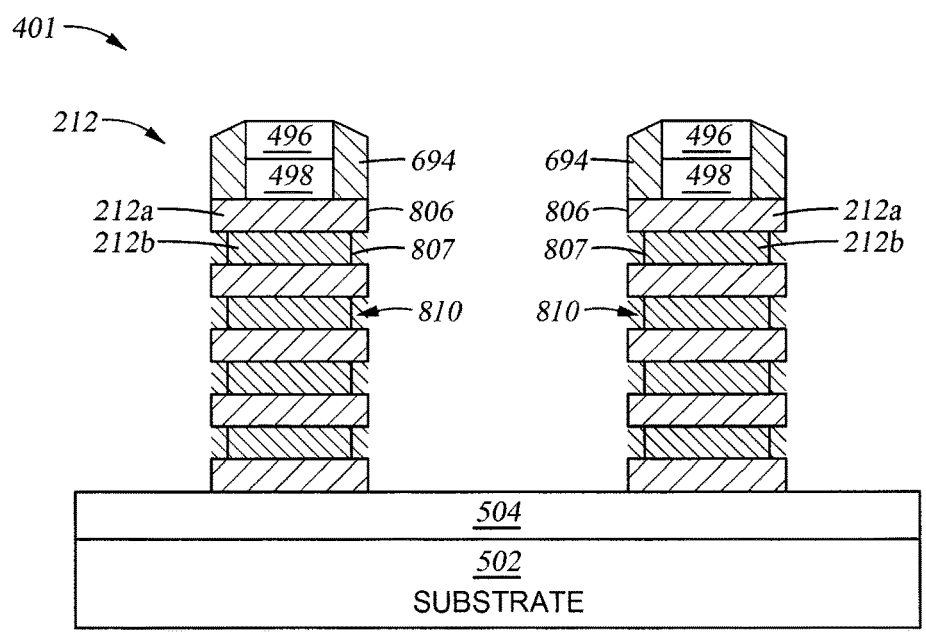

At operation 706, after the multi-material layer 212 is shrunk to the desired second width 802, a selective lateral etching process is then performed to laterally remove a portion of the second layer 212b from sidewalls 807 of the second layer 212b, as shown in FIG. 8C, forming a recess 810 at the end of the second layer 212b. The lateral etching process is performed to selectively remove partially one type of material from the substrate 502. For example, the second layer 212b may be partially removed as depicted in FIG. 8C, forming the recess 810 at each sidewall 807 of the second layer 212b.

Similarly, as discussed above, based on different process requirements, different etching precursors are selected to selectively and specifically etch the second layer 212b to form the recess 810. In one example, the etching precursors are selected to have high selectivity between the first and the second layers 212a, 212b, and thus are be able to target and laterally etch the second layer 212b predominantly without attacking or damaging the other (i.e., non-target) layer. After a desired width of the second 212b is removed from the substrate 502, forming the recess 810, the lateral etching process at operation 503 may then be terminated.

Figure 8D:
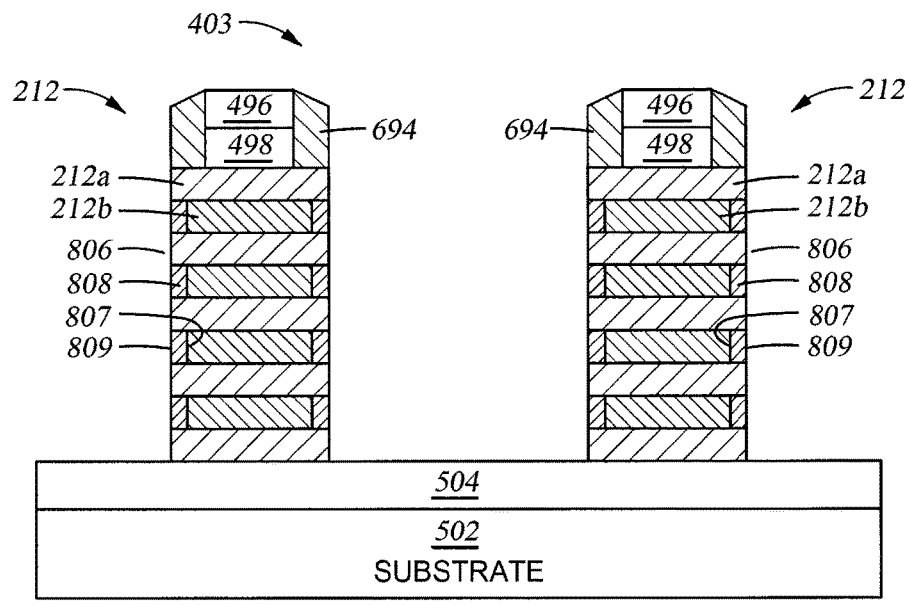

At operation 708, after the recess 810 is formed, an inner spacer 808 is then formed in the recess 810, as shown in FIG. 8D. The inner spacer 808 provides an outer sidewall 809 aligned with the sidewall 806 of the first layer 212a. Similarly, the inner spacer 808 as formed in FIG. 8D may be similar to the inner spacer 407 depicted in FIG. 4B and the inner spacer 625 layer depicted in FIG. 6H.

Figure 8E:
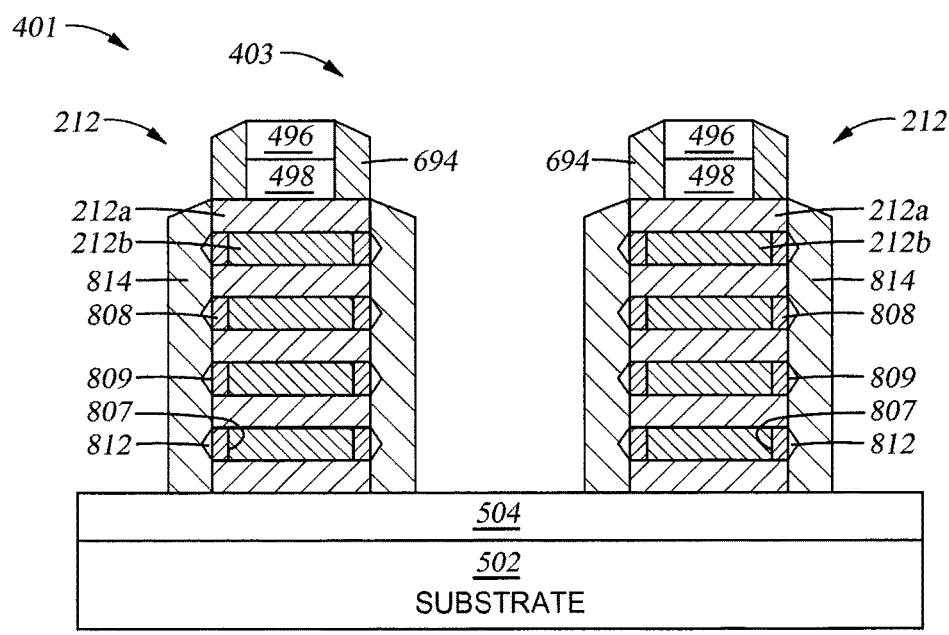

At operation 710, after the inner spacer 808 is formed, an epitaxial deposition process is performed to grow an epi-silicon layer 814, as shown in FIG. 8E. The epi-silicon layer 814 is similar to the epi-silicon layer 452, 612 depicted in FIG. 4D and FIG. 6F1. The epi-silicon layer 814 is formed from the first layer 212a. As the first layer 212a in this example is selected to fabricate from an intrinsic silicon material, the epitaxial deposition process as performed at operation 710 grows from the first layer 212a (e.g., a silicon compatible material) rather than the inner spacer 808 (e.g., a silicon dielectric layer or the like rather than an intrinsic silicon material) formed atop of the second layer 212b.

The epi-silicon layer 814 may then be continuously grown forming a shaped structure, as discussed above, to form the source/drain regions and the source/drain extension regions as needed for horizontal gate-all-around (hGAA) semiconductor devices on the substrate 502. The epitaxial growth process performed at operation 710 forms the silicon materials predominately atop the sidewall of the first layer 212a, a gap 812 (e.g., a void, a space or an air gap), similar to the gap 454 in FIG. 4D or the gap 610 in FIG. 6F1, may be formed close to sidewall 809 of the inner spacer 808. The silicon material is inert to the dielectric materials formed from the inner spacer 808. The gap 812 formed atop of the sidewall 809 of the inner spacer 808 may later be utilized to form as part of the nanowire spacer for nanowire structures for horizontal gate-all-around (hGAA) semiconductor devices on a substrate.

Thus, methods for forming nanowire structures with reduced parasitic capacitance and minimum device leakage and the source/drain and the extension regions for horizontal gate-all-around (hGAA) structures are provided. The methods utilize selective etching process as well as deposition of a doping layer along with an annealing process to form the nanowires and the epi-silicon layer for the source/drain and the extension regions that may be later utilized to form horizontal gate-all-around (hGAA) structures.

Thus, horizontal gate-all-around (hGAA) structures with desired type of material and device electrical performance for the nanowires and source/drain and the extension regions may be obtained, particularly for applications in horizontal gate-all-around field effect transistors (hGAA FET).

While the foregoing is directed to embodiments of the present invention, other and further embodiments of the invention may be devised without departing from the basic scope thereof, and the scope thereof is determined by the claims that follow.

The invention claimed is:

1. A method of forming nanowire structures and source/drain regions on a substrate comprising:
   selectively and laterally etching a first group of sidewalls of a first layer in a multi-material layer, wherein the multi-material layer comprises repeating pairs of the first layer and a second layer, the first and the second layers having the first group and a second group of sidewalls respectively, the first group and the second groups of sidewalls from the first layer and the second layer respectively exposed through openings defined in the multi-material layer;

forming a recess from the first group of sidewalls of the first layer and defining a vertical wall inward from the second group of sidewalls of the second layers;

forming a doping layer over the multi-material layer filling the recess defined in the first layer, wherein the doping layer comprises group III or group V dopants doped therein;

performing a thermal annealing process to drive the dopants from the doping layer into the second layer;

forming a dopant diffusion region in the second layer;

removing the doping layer from the substrate after the dopant diffusion region is formed in the second layer; and exposing the recess of the first layer.

2. The method of claim 1, further comprising:
forming an epi-silicon layer atop of sidewalls of the dopant diffusion region in the second layer.

3. The method of claim 2, wherein the epi-silicon layer is utilized as source/drain regions in horizontal gate-all-around (hGAA) structures.

4. The method of claim 1, further comprising:
forming an inner spacer in the recess of the first layer; and
forming an epi-silicon layer atop of sidewalls of the dopant diffusion region in the second layer.

5. The method of claim 4, further comprising:
forming an air gap atop of the inner spacer in the first layer.

6. The method of claim 1, wherein the doping layer is a boron doped silicon containing layer or a phosphate doped silicon containing layer.

* * * * *